United States Patent [19]

Miyazawa et al.

[11] Patent Number: 5,879,865
[45] Date of Patent: Mar. 9, 1999

[54] IMAGE FORMING METHOD

[75] Inventors: Kazuhiro Miyazawa; Shigeo Tanaka, both of Hino, Japan

[73] Assignee: Konica Corporation, Japan

[21] Appl. No.: 972,919

[22] Filed: Nov. 18, 1997

[30] Foreign Application Priority Data

Nov. 21, 1996 [JP] Japan .................................... 8-310632

[51] Int. Cl.⁶ ..................................................... G03C 7/30
[52] U.S. Cl. ......................... 430/373; 430/293; 430/301; 430/358; 430/414; 430/943
[58] Field of Search ..................................... 430/293, 301, 430/358, 373, 414, 943

[56] References Cited

U.S. PATENT DOCUMENTS

| | | | |
|---|---|---|---|
| 4,254,213 | 3/1981 | Masuda et al. ........................ | 430/381 |
| 4,994,350 | 2/1991 | Ogawa et al. ......................... | 430/358 |
| 5,707,786 | 1/1998 | Schmuck et al. ..................... | 430/943 |

FOREIGN PATENT DOCUMENTS 879049  10/1961  United Kingdom .

OTHER PUBLICATIONS

European Search Report EP 97 12 0198, Apr. 03, 1998.

*Primary Examiner*—Hoa Van Le
*Attorney, Agent, or Firm*—Jordan B. Bierman; Bierman, Muserlian and Lucas

[57] ABSTRACT

An image forming method for a silver halide photographic light sensitive material comprising a support having thereon a color image forming layer containing a silver halide emulsion and a dye forming coupler is disclosed, comprising (i) subjecting the photographic material to area modulation exposure and (ii) subjecting the exposed photographic material to amplifying development to form a color image.

9 Claims, No Drawings

IMAGE FORMING METHOD

FIELD OF THE INVENTION

The present invention relates to an image-forming method employing a silver halide photographic light-sensitive material (hereinafter referred to as "light-sensitive material"), and more specifically to an image-forming method in which, specifically in the case of preparing a color proof, dot gain is adjusted without causing deterioration of image quality. Furthermore, the present invention relates to an image-forming method wherein when an image is formed using a method in which a high illuminance exposure per pixel is performed for a short time such as $10^{-3}$ second or shorter, the dot gain is adjusted without causing the deterioration of image quality.

BACKGROUND OF THE INVENTION

At present, silver halide photographic light-sensitive materials have been increasingly employed because of the highly excellent features such as high sensitivity, excellent gradation and the like as compared to the other printing materials. As methods for preparing a color proof in color plate-making and printing process, some methods have been known, that is, one method wherein color separation is performed by placing, on a color light-sensitive material, a film for preparing each of yellow, magenta, cyan and black plates which are prepared by color separation and inversion to dot, and another method wherein a light-sensitive material is subjected to direct dot-like exposure not through a film according to image data followed by development process. In recent years, the color proof has been increasingly employed not only for position-proofing to confirm characters and pictures but also for tone-proofing to confirm delicate shading and hue. In printing, printed dot become lager than those in the original on account of ink blot and the like. The size difference ratio is termed dot gain. The dot gain corresponds to the gradation in an ordinary photograph to affect remarkably image quality. Therefore, in order to prepare the high quality proof, it is required to adjust the dot gain to the similar level of prints. In the color proof preparing method employing a light-sensitive material, there have been known a method in which the dot gain is adjusted by regulating an amount of exposure. However, when the method is employed for a negative type light-sensitive material, variation in the exposure amount results in variation in density. Accordingly, when the dot gains are matched, the resulting density becomes out of the limit of a standard and when the densities are matched, the dot gain is out of the standard. In the case of a positive type, the increase in the dot gain has tended to deteriorate white background and image quality. Furthermore, a method has been known in which the dot gain is adjusted changing the sharpness of a light-sensitive material. In order to increase the dot gain, it is necessary to degrade the sharpness. When the sharpness is degraded, the reproduction of a large dot and a small dot is remarkably degraded. Accordingly, the method has had the limitation for the adjustment of the dot gain. In addition, as a means for adjusting the dot gain, a method has been known in which the gradation of a light-sensitive material is adjusted in an appropriate range. A method is advantageous in which especially, the gradation from the middle density to the low density is designed to be somewhat soft. However, when, in the conventional image-forming method, the gradation (toe gradation) from the middle density to the low density is designed so as to be in the optimum range for the adjustment of the dot gain, at the same time, the gradation (shoulder gradation) from the middle density to the high density tends to become soft and requires the increase in exposure amount necessary to obtain the maximum density. As a result, improvement has been required because problems are likely caused when the exposure amount is changes as described above.

Furthermore, in recent years, in accordance with the digitization of image information, an image-forming method has been increasingly employed in which a light-sensitive material is subjected to high intensity exposure for a short time such as $10^{-3}$ second or shorter followed by development process. In this case, just the same problem has been caused. Furthermore, in the high-intensity, short-time exposure, a phenomenon has been frequently observed in which a characteristic curve does not become a smooth S-letter type curve and at an exposure beyond a certain value, it bends sharply, resulting in a reduced density. Generally speaking, there is a limit for the range which is digitally controlled. When the aforementioned decrease in the shoulder gradation or bend of the characteristic cure are caused, it is difficult to hold the sufficient maximum density in the adjustable exposure range. When the maximum exposure amount is set so as to obtain the sufficient maximum density, the white background is likely degraded. It has been difficult to adjust the dot gain without causing the degradation of image quality.

SUMMARY OF THE INVENTION

The present invention relates to an image-forming method employing a silver halide photographic light-sensitive material, and more particularly is to provide an image-forming method wherein in the case of preparing a color proof, dot gain is adjusted without causing the degradation of image quality. Furthermore, the present invention is to provide an image-forming method wherein when an image is formed using an exposure method in which a high illuminance exposure per one pixel is performed for a short time such as $10^{-3}$ second or shorter, dot gain is adjusted without causing the degradation of image quality.

The aforementioned object of the present invention has been accomplished by the following embodiments.

(1) An image-forming method characterized in that a silver halide photographic light-sensitive material comprising a support having thereon at least a color image-forming layer containing a light-sensitive silver halide emulsion and a coupler is subjected to an area modulation exposure followed by an amplifying development process.

(2) An image-forming method as described in the aforementioned (1), characterized in that the area modulation exposure is performed through an image which is recorded utilizing area modulation on a transparent support.

(3) An image-forming method as described in the aforementioned item 1 or item 2, characterized in that the area modulation exposure per pixel is performed for $10^{-3}$ second or shorter.

(4) An image-forming method as described in one of the aforementioned items 1, 2 and 3, characterized in that an amount of silver halide in the color image-forming layer is 0.05 g/m² or less in terms of silver.

DETAILED DESCRIPTION OF THE INVENTION

The image-forming method of the present invention is characterized in that a light-sensitive material is subjected to an area modulation exposure, followed by the amplifying development process. The area modulation described herein implies expression of high and low densities of an image using both small and large areas of a region having a constant density and the representative example includes halftone dots employed in conventional printing. There are preferably employed methods in which a halftone image previously formed on a transparent support is brought into contact with the silver halide light-sensitive material and is then subjected therethrough to uniform exposure, and further in which a halftone image is exposed directly onto the silver halide photographic light-sensitive material while using a light source such as a laser.

The image-forming method of the present invention is preferably applied to light-sensitive materials forming images for direct visual appreciation. Examples include color paper, color reversal paper, light-sensitive materials forming direct positive images, light-sensitive materials for use in displays, light-sensitive materials for use in color proofs. Of these, the image-forming method is particularly advantageous in preparing the color proof utilizing dot image information obtained by color separations and conversion to dot image in a printing process.

The reason has not yet been clarified as to why the advantages of the present invention can be obtained. However, it is assumed that when subjected to the amplifying development, shoulder gradation is enhanced while toe gradation remains soft as compared to conventional color development processes.

Various kinds of light sources can be employed in the present invention including xenon discharge tubes, cathode ray tubes (CRT), light-emitting diodes (LED), tungsten halogen lamps, mercury high pressure discharge tubes, gas lasers semiconductor lasers (LD) and known light sources such as a combination of LD with a second harmonic generation element (a so-called SHG element). Especially when an exposure is performed in which the exposure time is $10^{-3}$ second or shorter per pixel, light sources such as LED, LD, and combinations of LD with an SHG element, are preferably employed, based on image quality, small dimensions, easy control of light amount, etc.

In the image-forming method of the present invention, when the exposure time becomes $10^{-3}$ second or shorter per pixel, the advantages of the present invention are markedly exhibited, and that is the embodiment in which the present invention is effectively employed. The exposure time described herein is defined as follows. In the case of a flash exposure, the exposure time is defined, in the change in the intensity with time, as a period of time between the time when the light intensity reaches a half of the maximum and the time when it reaches a half of the maximum in the course of the decay in the intensity. In the case of a scanning exposure employing a laser, the exposure time is defined as a value derived by dividing the light flux diameter by the scanning speed, wherein the light flux diameter is the distance between two points where the resulting line is parallel to the scanning line and passes the point of a maximum light intensity and the periphery of the light flux intersecting each other, wherein the periphery of the light flux is defined as the point where the light intensity becomes a half of the maximum value, in spatial terms of the intensity of the light flux. The same consideration as in the aforementioned scanning exposure employing a laser, can be applied to that employing an array of light sources.

Exposure apparatuses which can be applied to the image-forming method of the present invention include, for example, those described in Japanese Patent Publication Open to Public Inspection Nos. 55-4071 and 59-11062, Japanese Patent Publication Nos. 56-14963 and 5640822, European Pat. No. 77410, Technical Research Report of Electronic Communication Society, Vol. 80, No. 244, Eiga Terebi Gijutsu (Movie Television Technology), 1984/6 (382), pp. 24 to 36, etc.

The amplifying development process is explained as follows. In the present invention, the amplifying development process is defined as a method in which a latent image formed by exposing a light-sensitive material is developed by a color or black-and-white developer to form developed silver, and an image dye which is formed utilizing a chemical reaction employing the aforementioned developed silver, serving as a catalyst, is formed or released. For example, a method is illustrated in which an image dye is formed upon reaction of a coupler with an oxidized developing agent formed by a redox reaction between the developing agent and an oxidizing agent employing the developed silver as a catalyst.

As the oxidizing agents, there can be employed hydrogen peroxide releasing compounds such as hydrogen peroxide and addition compounds of hydrogen peroxide; peroxo compounds such as peroxoborates, peroxocarboxylates, etc.; cobalt (III) complexes such as cobalt hexamin complex; halous acids such as chlorous acid and periodic acid, etc. Of these, a method utilizing hydrogen peroxide is advantageous because the high amplifying effect is exhibited and the load to the environment is reduced.

In the amplifying development process according to the present invention, a combination of an aromatic primary amine developing agent with hydrogen peroxide is preferably employed. The aromatic primary amine developing agents include compounds such as N,N-diethyl-p-phenylenediamine, 2-amino-5-diethylaminotoluene, 2-amino-5-(N-ethyl-N-laurylamino)toluene, 4-(N-ethyl-N-(β-hydroxyethyl)amino)aniline, 2-methyl-4-(N-ethyl-N-(β-hydroxyethyl)amino)aniline, 4-amino-3-methyl-N-ethyl-N-(β-(methanesulfonamido)ethyl)aniline, N-(2-amino-5-diethylaminophenylethyl)methanesulfonamide, N,N-dimethyl-p-phenylenediamine, 4-amino- 3-methyl-N-ethyl-N-methoxyethylaniline, 4-amino-3-methyl-N-ethyl-N-(β-ethoxyethyl)aniline, 4-amino-3-methyl-N-ethyl-N-(γ-hydroxypropyl)aniline, 4-amino-3-methyl-N-ethyl-N-(4-hydroxybutyl)aniline, 4-amino-3-methyl-N-ethyl-n-(β-hydroxypropyl)aniline, 4-amino-3-methyl-N-ethyl-N-(2-hydroxy(1-methyl)ethyl)aniline, 4-amino-3-ethyl-N-methyl (γ-hydroxypropyl)aniline, etc. and various kinds of aromatic primary amine developing agents described in Japanese Patent Publication Open to Public Inspections Nos. 3-345142, 4-11255, 4-45440, 4-226452, 4-371948, etc.

In the present irvention, it is possible to supply to a light-sensitive material a processing solution in which the aforementioned color developing agent and an oxidizing agent for use in the amplifying development process is concurrently present. Furthermore, it is also possible to prepare independently a processing solution containing the developing agent and a solution containing the oxidizing agent for use in the amplifying development process and to supply them to the light-sensitive material.

The amplifying development method according to the present invention includes, for example, a method described in Japanese Patent Publication Open to Public Inspection Nos. 52-13335, 55-127555, 61-77851, etc. wherein a developing agent and an oxidizing agent are present in one processing solution (hereinafter processing solution containing both of a developing agent and an oxidizing agent is expressed as "developing-amplifying solution".) and the formation of the developed silver which acts as a catalyst followed by the amplifying development process is performed in the same solution, a method described in Japanese Patent Publication Open to Public Inspection No. 5-216192, 5-346647, etc. wherein a developing solution Containing a developing agent and an amplifying solution containing an oxidizing agent are separated, and in the developing solution, developed silver is formed and the developing agent is carried over to the amplifying solution to result in amplifying development, and a method as described in Japanese Patent Publication Open to Public Inspection Nos. 61-88259, 7-077788, etc. wherein the developed silver is formed through processing in a developing solution containing a developing agent and the amplifying development process is then conducted in a processing solution containing the developing agent and an oxidizing agent. Furthermore, a method which utilizes no processing solution can be employed as described in, for example, Japanese Patent Publication Open to Public Inspection No. 61-80150 wherein a developing solution or an amplifying solution is sprayed to a silver halide light-sensitive material.

When the developing solution and the amplifying solution are separated, the amount of the developing agent in a developing solution is preferably from 0.2 to 25 g/liter and more preferably from 1 to 20 g/liter. Furthermore, the amount of hydrogen peroxide (30% solution) is from 0.1 to 100 ml/liter.

When processing is performed in a single solution combining the developing solution with the amplifying solution, the amount of the developing agent in the developing/amplifying solution is preferably from 0.5 to 15 g/liter and more preferably from 1 to 7 g/liter, and the amount of hydrogen peroxide (30% solution) is preferably 0.1 to 30 ml/liter and more preferably 1 to 5 ml/liter.

In the present invention, processing temperatures during amplifying development are preferably 20° C. or higher and 60° C. or lower. Higher temperatures make preferably it possible to perform the processing in a short period of time. However, in view of the stability of the processing solution, not so high temperatures are preferable and the processing is preferably performed at 25° C. or higher and 55° C. or lower.

The amplifying development time varies depending on processing temperatures, activity of the processing solution, etc., and in the present invention, is preferably 180 seconds or shorter and more preferably 90 seconds or shorter.

Known chemical compounds composing the developing solution can be added to the developing solution, the amplifying solution and the developing/amplifying solution in addition to the aforementioned color developing agent and oxidizing agent. Generally, are employed development retarders, preserving agents, chelating agents, etc. such as alkali agents having pH buffering function, chloride ion, benzotriazole and the like.

As the pH buffering agents, known pH buffering agents can be employed. Of them, the pH buffering agent composed of a combination of potassium carbonate (or sodium)/potassium bicarbonate (or sodium) is very preferable because of possible reduction in cost and high compatibility with the environment.

The pH of the amplifying development solution according to the present invention is not limited. However, when a light-sensitive material having a plurality of color image-forming layers is subjected to amplifying development process, the pH is preferably less than 10.3 in view in which each gradation balance between color image-forming layers is consistently reproduced and specially preferably 10.0 or lower.

As couplers employed in the light-sensitive material according to the present invention, can be employed any compounds which can form a coupling product (e.g., a dye) having a spectral absorption maximum at the wavelengths of 340 nm or longer upon coupling with an oxidized color developing agent. Particularly, representative compounds include a yellow dye forming coupler having a spectral absorption maximum at the wavelengths in the region of 350 to 500 nm, magenta dye forming coupler having a spectral absorption maximum at the wavelengths in the region of 500 to 600 nm and a cyan dye forming coupler having a maximum spectral absorption at the wavelengths in the region of 600 to 750 nm.

As the yellow couplers, acylacetoanilide series couplers are preferable. Of them, benzoylacetoanilide series and pivaloylacetanilide series compounds are advantageous. The compounds represented by the following general formula (Y) are particularly preferable:

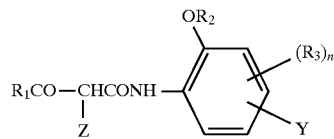

In the formula, $R_1$ represents an alkyl group, a cycloalkyl group or an aryl group; $R_2$ represents an alkyl group, a cycloalkyl group, an acyl group or an aryl group and $R_3$ represents a group which can be substituted to a benzene ring. n represents 0 or 1. Z represents a hydrogen atom or a group that can be released upon reacting with an oxidized color developing agent and Y represents an organic group.

Specifically, can be illustrated Y-I-1 to Y-I-51 described on pages (7) to (10) of Japanese Patent Publication Open to Public Inspection No. 3-39958. Furthermore, the following couplers are preferably employed.

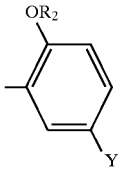

| No. | R₂ | Z | Y |
|---|---|---|---|
| Y-1 | $-CH_3$ | 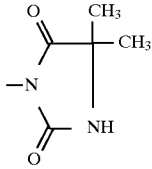 | $-NHCOC_{17}H_{35}$ |
| Y-2 | $-CH_3$ | | $-COOC_{14}H_{29}$ |
| Y-3 | $-CH_3$ | | $-NHCO-CHCH_2SO_2C_{12}H_{25}$<br>$\quad\quad\quad\quad\;\; |$<br>$\quad\quad\quad\quad\;\; CH_3$ |
| Y-4 | $-C_{16}H_{33}$ | | $-NHCO-CHCH_2SO_2CH_3$<br>$\quad\quad\quad\quad\;\; |$<br>$\quad\quad\quad\quad\;\; CH_3$ |
| Y-5 | $-CH_3$ | | $-NHCO-CHCH_2SO_2C_{12}H_{25}$<br>$\quad\quad\quad\quad\;\; |$<br>$\quad\quad\quad\quad\;\; CH_3$ |
| Y-6 | $-CH_3$ | | $-NHCO-CHCH_2SO_2C_{12}H_{25}$<br>$\quad\quad\quad\quad\;\; |$<br>$\quad\quad\quad\quad\;\; CH_3$ |

As the magenta couplers, can be employed 5-pyrazolone series, pyrazoloazole series, pyrazolinobenzimidazole series, indazolone series, acylacetonitrile series couplers, etc. These are described in, for example, U.S. Pat. Nos. 2,600,788, 3,062,653, 3,512,896, 3,558,318, 3,930,866, Japanese Patent Publication Open to Public Inspection Nos. 49-29639, 50-13041, etc. Pyrazoloazole series magenta couplers represented by the general formula (M) are particularly preferable.

General Formula (M)

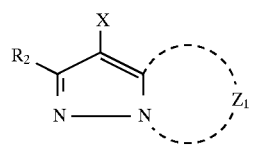

In the formula, $Z_1$ represents a group of nonmetallic atoms required for forming a nitrogen containing heterocyclic ring and a ring formed by $Z_1$ can contain a substituent.

X represents a hydrogen atom or a group which can be released upon reacting with an oxidized color developing agent.

Preferred examples that can be employed in the present invention include compounds described in the third line on page 5 to the 16th line on page 30 in Japanese Patent Publication Open to Public Inspection No. 3-163444. Specific examples of the aforementioned magenta couplers include couplers No. 1 to No. 61 described on pages 16 to 29 of the aforementioned patent specification. Furthermore, are included couplers M-1 to M-41 described on pages 34 to 58 of Japanese Patent Publication Open to Public Inspection 2-208653.

As cyan couplers, phenol or naphthol series couplers are generally employed. These cyan couplers are described in, for example, U.S. Pat. Nos. 2,369,992, 2,434,272, 2,698,974, 3,034,892 and 3,839,044, and Japanese Patent Publication Open to Public Inspection Nos. 47-3742, 50-112038, 50-130441 and 2-251845, etc.

Specific examples of the aforementioned cyan couplers include couplers No. I-1 to I-31 in the upper left column on page 4 to the lower left column on page 5 of Japanese Patent Publication Open to Public Inspection No. 2-251845. Furthermore, including these couplers, specific examples of cyan couplers that can be employed in the present invention are described in Japanese Patent Publication No. 49-11572, Japanese Patent Publication Open to Public Inspection Nos. 61-3142, 61-9652, 61-39045, 61-50136, 61-9914, 61-105545, etc. Diacylaminophenol series cyan couplers are particularly preferable. There are also preferably employed cyan couplers represented by formulas (I), (II) and (III) described in Japanese Patent Application No. 9-162545, at page 10–24.

When an oil-in-water type emulsifying dispersion method is employed for adding employed couplers and other organic compound to the light-sensitive material according to the present invention, those are dissolved to a water-insoluble high-boiling point organic solvent having a boiling point of 150° C. or higher together with a low boiling and/or water-soluble organic solvent if desired, and the resulting solution is emulsified and dispersed employing a surface active agent into a hydrophilic binder such as an aqueous gelatin solution. The dielectric constant of the high-boiling point organic solvent which can be employed for dissolving and dispersing a dye-providing substance is preferably from 3.5 to 7.0. Furthermore, the combination of two or more of the high-boiling point organic solvents can be employed.

Furthermore, an alternative method for one employing the high-boiling point organic solvent can be employed in which a water-insoluble, organic solvent-soluble polymer compound is dissolved to a low-boiling and/or water-soluble organic solvent and the resulting solution is emulsified and dispersed employing a surface active agent in a hydrophilic binder such as an aqueous gelatin solution and employing any of various dispersion means.

Preferred compounds as surface active agents employed for adjusting the surface tension at the dispersion of photographic additives and coating include those comprising a hydrophobic group having from 8 to 30 carbon atoms and a sulfonic acid group or its salt in one molecule. Furthermore, the surface active agents having a fluorine substituted alkyl group are preferably employed. Any of these dispersions is added to a coating solution comprising a silver halide emulsion. In such an instance, a period of time from the completion of dispersion to the addition to the coating solution and from the completion of the addition to the coating solution to the initiation of coating should be short, and preferably 10 hours or less for each and more preferably 3 hours or less, or 20 minutes or less.

In order to prevent fading of formed dye images from light, heat, moisture, etc., it is preferred that anti-fading additives are employed together with couplers. Particularly preferred compounds for magenta dyes include phenyl ether series compounds represented by the general formula I and II described on page 3 of Japanese Patent Publication Open to Public Inspection No. 2-66541, phenol series compounds represented by the general formula IIIB described in Japanese Patent Publication Open to Public Inspection 3-174150, amine series compounds represented by the general formula A described in Japanese Patent Publication Open to Public Inspection No. 64-90445, and metal complexes represented by the general formulas XII, XIII and XIV described in Japanese Patent Publication Open to Public Inspection No. 62-182741. Furthermore, preferred compounds specially for yellow and cyan dyes include compounds represented by the general formula I' described in Japan Patent Publication Open to Public Inspection No. 1-196049 and represented by the general formula II described in Japanese Patent Publication Open to Public Inspection No. 5-11417.

For the purpose of shifting an absorption wavelength of formed dyes, can be employed a compound (d-11) described in the lower left column on page 9 and a compound (A'-1) described in the lower column on page 10 of Japanese Patent Publication Open to Public Inspection No. 4-114154. Furthermore, besides these, can be employed fluorescent dye releasing compounds described in U.S. Pat. No. 4,774,187.

In the light-sensitive material of the present invention, it is preferred to prevent color contamination and improve fog, etc. by adding compounds capable of reacting with an oxidized developing agent to a layer between light-sensitive layers and to a silver halide emulsion layer, respectively. For these purpose, hydroquinone derivatives are preferable and alkylhydroquinones such as 2,5-di-t-octylhydroquinone are more preferable.

In the light-sensitive material according to the present invention, it is preferred to prevent static fog and improve light fastness by adding UV absorbents. Preferred UV absorbents include benzotriazoles and particularly preferred compounds include those represented by the general formula III-3 described in Japanese Patent Publication Open to Public Inspection No. 1-250944, those represented by the general formula III described in Japanese Patent Publication Open to Public Inspection No. 64-66646, UV-1L to UV-27L described in Japanese Patent Publication Open to Public Inspection No. 63-187240, those represented by the general formula I described in Japanese Patent Publication Open to Public Inspection No. 4-1633 and those represented by the general formulas (I) and (II) described in Japanese Patent Publication Open to Public Inspection No. 5-165144.

Silver halide photographic emulsion compositions according to the present invention are of optional halide compositions, including silver chloride, silver bromide, silver chlorobromide, silver iodobromide, silver chloroiodobromide, silver chloroiodide, etc. Of these, the high chloride silver halide emulsion havinging a silver chloride content of 80 mole percent or more is preferable because it exhibits the advantages of the present invention without causing the decrease in the maximum density due to the retardation of the amplifying development; the silver halide emulsion having a silver chloride content of 90 mole percent or more is more preferable and further, the silver chloride content of 95 to 99.9 mole percent is still more preferable.

As the silver halide emulsion according to the present invention, can be preferably employed the silver halide emulsion grains having a region where the content of silver bromide is high. In this case, the region where the content of silver bromide is high may be a so-called core/shell emulsion forming perfect layers or an emulsion having a so-called epitaxial junction wherein a region exists in which the composition is partially different without forming the perfect layer. In addition, the composition may continuously vary or may vary not continuously. The region where the concentration of silver bromide is high is preferably located at the corner of a silver halide grain.

In order to enhance photographic performance, heavy metal ions are preferably incorporated. These compounds prevent effectively a sharp inflection of a characteristic curve caused by a high intensity, short time exposure. Heavy metal ions which can be employed for this purpose include an ion of each of the Groups 8 to 10 metals such as iron, iridium, platinum, palladium, nickel, rhodium, osmium, ruthenium, cobalt, etc. and the Group 12 metals such as cadmium, zinc, mercury, etc. and lead, rhenium, molybdenum, tungsten, gallium, chromium. Of these, any ion of iron, iridium, platinum, ruthenium, gallium, osmium is preferable.

Any of these ions can be added to the silver halide emulsion in the form of a salt or complex.

When the aforementioned heavy metal ion forms a complex, preferred examples of the ligands include a cyanide ion, a thiocyanate ion, an isc,thiocyanate ion, a cyanate ion, a chloride ion, a bromide ion, an iodide ion, carbonyl, ammonia, etc. Of those, the cyanide ion, the thiocyanate ion, the isocyanate ion, the chloride ion and the bromide ion, etc.

To allow a heavy metal ion to be occluded within the silver halide emulsion grains according to the present invention, the addition of the corresponding heavy metal compound may be optionally conducted at any point of each process before forming silver halide grains, during forming silver halide grains and during physical ripening after forming silver halide grains. In order to prepare the silver halide emulsion which meets the aforementioned conditions, the heavy metal compound is dissolved together with halide salts and the resulting solution can be continuously added during whole or part of a grain forming process.

The addition amount of the aforementioned heavy metal ion in the silver halide emulsion is preferably $1 \times 10^{-9}$ mole or more and $1 \times 10^{-2}$ mole or less per 1 mole of silver halide, and particularly preferably $1 \times 10^{-8}$ mole or more and $5 \times 10^{-5}$ mole or less per 1 mole of silver halide.

Any shape of the silver halide grains according to the present invention can be optionally employed. One of preferred examples is a cube having (100) faces as crystal surfaces. Furthermore, grains having the shape of octahedron, tetradecahedron, dodecahedron, etc. are prepared according to methods described in U.S. Pat. Nos. 4,183,756, 4,225,666, Japanese Patent Publication Open to Public Inspection No. 55-26589, Japanese Patent Publication No. 55-42737 and in Journal Photographic Science, Vol. 21, p. 39 (1973), etc., and are employed. Furthermore, grains having twinning faces may be employed.

As the silver halide grains according to the present invention, grains having the sane shape are preferably employed. In addition, two or more of monodispersed silver halide emulsions are preferably added to the same layer.

There is no particular limitation on the grain size of the silver halide grains employed in the present invention. However, from view of other photographic properties such as rapid processing capability, sensitivity, etc., the grain diameter is preferably in the range of 0.1 to 1.2 $\mu$m and more preferably in the range of 0.2 to 1.0 $\mu$m.

The grain size of the silver halide grains can be measured using various kinds of methods generally employed in the field of photographic technology. The representative methods are those described in Loveland "Particle Size Analytical Method" (A.S.T.M. Symposium on Light Microscopy, pp. 94 to 122, 1955) or "The Theory of the Photographic Process Third Edition" (Mees and James, Chapter 2, Macmillan Co. 1966).

Apparatuses for preparing the silver halide emulsion and the preparation methods known in the art in the photographic industry can be employed.

The silver halide emulsion according to the present invention can be prepared employing any of an acid method, a neutral method or an ammonia method. The grains can be grown at one time and can be grown after preparing seed grains. The method for preparing the seed grains and the method for growing grains can be the same or different.

Furthermore, as methods for reacting soluble silver salts with soluble halide salts, any of a normal mixing method, a reverse mixing method, a double jet method or combination thereby can be employed. However, the double jet method is preferably employed. Further, a pAg controlled double jet method can be employed which is described as one of the simultaneous mixing methods in Japanese Patent Publication Open to Public Inspection No. 54-48521.

Furthermore, apparatuses can be employed described in Japanese Patent Publication Open to Public Inspection Nos. 57-92523, 57-92524, etc. wherein an aqueous water-soluble silver salt solution and an aqueous halide salt solution are supplied from addition devices arranged in a reaction mother solution, described in German Patent Open to Public Inspection No. 2,921,164, etc. wherein an aqueous water-soluble silver salt solution and an aqueous halide salt solution are added while changing continuously the concentration, described in Japanese Patent Publication No. 56-501776 wherein a reaction mother solution is taken out of a reactor and by increasing the concentration using an ultrafiltration method, grains are grown while holding distances between silver halide grains constant.

Furthermore, silver halide-dissolving solvents such as thioether, etc. can be employed, if desired. In addition, compounds having a mercapto group, nitrogen containing heterocyclic compounds or compounds such as spectral sensitizers can be added during the formation of sliver halide grains or after the grain formation.

As the silver halide grains according to the present invention, a so-called tabular silver halide is preferably employed in order to control the gradation balance. As the tabular grain containing the high concentration of silver chloride, a grain having a (111) principal plain and a grain having a (100) principal plain have been known. However, in view of the stability of the grain shape, the grain having the (100) principal plain is preferably employed.

Sensitizing methods utilizing gold compounds and chalcogen sensitizers are combined and can be applied to the silver halide emulsion according to the present invention. Especially at an exposure time per one pixel of $10^{31\ 3}$ second or shorter, the sensitizing method utilizing gold compounds is preferable because the advantages of the present invention can be remarkably exhibited.

As the chalcogen sensitizers applied to the silver halide emulsion according to the present invention, sulfur sensitizers, selenium sensitizers, tellurium sensitizers and the like can be employed and of them, the sulfur sensitizers are preferable.

In the silver halide emulsion according to the present invention, antifoggants and stabilizers known in the art are employed for the purpose of the prevention of fog caused during the preparation processes, the decrease in quality variations during storage and the prevention of fog caused during development. Preferred compounds which can be employed for the purpose include, for example, those represented by the general formula (II) in the lower column on page 7 in Japanese Patent Publication Open to Public Inspection No. 2-146036. According to the purpose, these compounds are added during processes such as preparation of silver halide emulsion, chemical sensitization, the completion of chemical sensitization and preparation of coating solutions.

In the light-sensitive material according to the present invention, it is desirable that, as mentioned above, there is an amount of silver halide grains which is just necessary for yielding developed silver utilized as a catalyst at the amplifying development. As compared with, for example, the conventional color development method in which an oxidized color developing agent necessary for coupling with a coupler is formed by a redox reaction of a developing agent with silver halide, it is possible to reduce markedly the amount of silver halide. In this case, the amount of silver halide is preferably 50 mg/m$^2$ or less in terms of silver and more preferably 30 mg/m$^2$ or less. The more the amount of silver halide is decreased, the more advantages are obtained such that the time necessary for bleach-fix after the amplifying development process can be shortened and compounds which have not been utilized due to insufficient activity even though they have good compatibility with the environment can be employed.

To the light-sensitive material according to the present invention, dyes having absorption in the various wavelength region can be employed for the purpose of the prevention of irradiation and halation. For the purposes, any of compounds known in the art can be employed. However, particularly, as dyes having absorption in the visible region, are preferably employed dyes AI-1 to 11 described on page 308 of Japanese Patent Publication Open to Public Inspection No. 3-251840 and dyes described in Japanese Patent Publication Open to Public Inspection No. 6-3770, and as infrared-ray absorbing dyes, compounds represented by the general formulas (I), (II) and (III) described in the left lower column on page 2 of Japanese Patent Publication Open to Public Inspection No. 1-280750 have preferred absorption characteristics, and are preferably employed because no adverse effect on photographic properties of silver halide photographic emulsions and no stain due to remaining color are caused.

For the purpose of improving sharpness, the preferred addition amount of these dyes is that the reflection density of a sample which has rot been processed is preferably 0.7 or more and more preferably 0.8 or more.

In order to improve a white background, an optical brightening agent is preferably added to the light-sensitive material according to the present invention. Compounds preferably employed include those represented by the general formula II in Japanese Patent Publication Open to Public Inspection No. 2-232652.

The light-sensitive material according to the present invention, when used as a color photographic light-sensitive material, comprises layers comprising silver halide emulsions which are combined with a yellow coupler, a magenta coupler or a cyan coupler, and are spectrally sensitized to the specified regions in the wavelength of 400 to 900 nm. The above emulsion also comprises one or a plurality of spectral sensitizers.

As spectral sensitizers employed in the silver halide emulsion according to the present invention, can be employed any compounds known in the art. As blue-sensitive spectral sensitizers, can be preferably employed individually or in combination BS-1 to 8 described on page 28 of Japanese Patent Publication Open to Public Inspection No. 3-251840. As green-sensitive spectral sensitizers, can be preferably employed GS-1 to 5 described on 29 page in the same Publication mentioned above. As red-sensitive spectral sensitizers, can be preferably employed RS-1 to 8 described on page 29 in the same Publication mentioned above. Furthermore, when an imagewise exposure is performed by infrared radiation using a semiconductor laser and the like, it is necessary to employ an infrared-sensitive spectral sensitizer. As the infrared-sensitive spectral sensitizers, are preferably employed IRS-1 to 11 described on pages 6 to 8 in Japanese Patent Publication Open to Public Inspection No. 4-285950. Furthermore, any of these infrared-, red-, green- and blue-sensitive spectral sensitizers is employed preferably by combining with supersensitizers SS-1 to 9 described on pages 8 to 9 in Japanese Patent Publication Open to Public Inspection No. 4-285950 and compounds S-1 to S-17 described on pages 15 to 17 in Japanese Patent Publication Open to Public Inspection No. 5-66515.

These spectral sensitizers are added optionally at any time between the formation of silver halide grains and the completion of chemical ripening.

The spectral sensitizers can be added as a solution which is prepared by dissolving any of them in water-compatible solvents such as methanol, ethanol, fluorinated alcohol, acetone, dimethylformamide, etc. or water, or can be added as a solid dispersion.

In the light-sensitive material according to the present invention, gelatin is advantageously employed as a binder. However, if desired, can be employed other gelatin, gelatin derivatives, graft polymers of gelatin with other polymers, proteins other than gelatin, sugar derivatives, cellulose derivatives, hydrophilic colloid such as synthetic hydrophilic high molecular substances like single- or copolymer.

As hardeners for these binders, vinyl sulfone type hardeners or chlorotriazine type hardeners are preferably employed individually or in combination. Compounds described in Japanese Patent Publication Open to Public Inspection Nos. 61-249054 and 61-245153 are preferably employed. Furthermore, in order to prevent the propagation of mold or bacteria which adversely affect photographic properties and image preservation, antiseptic and mold proofing agents such as those described in Japanese Patent Publication Open to Public Inspection No. 3-157646 are preferably added to colloid layers. In addition, in order to improve physical properties of the surface of a light sensitive material before and after processing, are preferably added to a protective layer lubricants and matting agents described in Japanese Patent Publication Open to Public Inspection Nos. 6-118543 and 2-73250.

As supports employed in the photographic material according to the present invention, any material is employed. Paper laminated with polyethylene or polyethylene terephthalate, paper support composed of natural pulp or synthetic pulp, vinylchloride sheet, polypropylene which may contain white pigments, polyethylene terephthalate support, baryta paper, etc. are employed.

Inorganic and/or organic white pigments are employed in the support. Preferably inorganic white pigments are employed.

The value of center plane mean roughness (SRa) of the support is preferably 0.15 μm or less and more preferably 0.12 μm or less because good glossy effect is exhibited. Furthermore, in order to improve the whiteness by adjusting the spectral reflection density of a white portion after processing, a small amount of a bluing agent or a red dye such as ultramarine, oil-soluble dye, etc. is preferably added to a white pigment containing water-resistant resin or a coated hydrophilic colloid layer.

In the light-sensitive material according to the present invention, the surface of a support is subjected to corona discharging, irradiation of ultraviolet radiation, fire flame treatment, etc., if desired and coating may be then performed directly on the surface or on a subbing layer (one or a plurality of subbing layers for the improvements in properties such as adhesion of the support surface, prevention of static charge, dimensional stability, abrasion resistance, hardness, anti-irradiation, friction and/or the like).

At coating of the light-sensitive material according to the present invention, a viscosity increasing agent can be employed in order to improve coating properties. As coating methods, extrusion coating and curtain coating are particularly useful in which two or more of layers can be simultaneously coated.

In the image-forming method of the present invention, after color development, a bleach process and a fix process can be performed. The bleach process can be performed with the fix process at the same time. After the fix process, a wash process using water is generally performed. Furthermore, in place of the water washing, a stabilizing process can be performed. As apparatuses employed for the image-forming method of the present invention, are available a roller transport type in which a light-sensitive material is transported between rollers arranged in a processing tank or a endless belt type in which a light-sensitive material is attached and fixed to a belt. Furthermore, there are available a system in which a processing tank is shaped to a slit and a processing solution is supplied to the slit while transporting a light-sensitive material through the slit, a spray system in which a processing solution is sprayed onto a light-sensitive material, a web system in which a light-sensitive material is in contact with a member impregnated with a processing solution, a system utilizing a viscous processing solution, etc.

EXAMPLES

The present invention is explained below, with reference to examples. However, embodiments of the present invention are not limited to the examples.

Example 1
Preparation of Blue-sensitive Silver Halide Emulsion (Em-B1)

To 1 liter of an aqueous 2% gelatin solution heated at 40° C., the following A1 Solution and B1 Solution were simultaneously added while controlling at pAg=7.3, pH=3.0, and further, the following C1 Solution and D1 Solution were simultaneously added while being controlled at pAg=8.0 and pH=5.5. At this time, the pAg was controlled according to the method described in Japanese Patent Publication Open to Public Inspection No. 59-45437 and the pH was controlled using sulfuric acid or an aqueous sodium hydroxide solution.

(A1 Solution)

| Sodium chloride | 3.42 g |
| --- | --- |
| Potassium bromide | 0.03 g |
| Water to make | 200 ml |

(B1 Solution)

| Silver nitrate | 10 g |
| --- | --- |
| Water to make | 200 ml |

(C1 Solution)

| Sodium chloride | 102.7 g |
| --- | --- |
| Potassium hexachloroiridium (IV) | $4 \times 10^{-8}$ mole |
| Potassium hexacyanoferrate (II) | $2 \times 10^{-5}$ mole |
| Potassium bromide | 1.0 g |
| Water to make | 600 ml |

(D1 Solution)

| Silver nitrate | 300 g |
| --- | --- |
| Water to make | 600 ml |

After finishing the addition, soluble salts were removed using an aqueous 5% Demol N (manufactured by Kao Atlas Co.) solution and an aqueous 20% magnesium sulfate solution followed by mixing with an aqueous gelatin solution. Thus, a monodispersed cubic grain emulsion EMP-1A was prepared which had an average grain diameter of 0.71 μm, a variation coefficient of grain diameter distribution of 0.07, and a silver chloride content of 99.5 mole %. Subsequently, a monodispersed cubic grain emulsion EMP-1B was prepared in the same manner as in the preparation of EMP-1A except that the addition period of A1 Solution and B1 Solution, and the addition period of C1 Solution and D1 Solution were changed. The EMP-1B had an average grain diameter of 0.64 μm, a variation coefficient of a grain diameter distribution of 0.07, and a silver chloride content of 99.5 mole %.

The aforementioned EMP-1A was subjected optimally to chemical sensitization at 60° C. using the following compounds. In the same way, EMP-1B was subjected to optimum chemical sensitization. The sensitized EMP-1A and EMP-1B were mixed in a ratio of 1:1 in terms of silver amount and a blue-sensitive silver halide emulsion (Em-B1) was obtained.

| Sodium thiosulfate | 0.8 mg/mole AgX |
| --- | --- |
| Chloroauric acid | 0.5 mg/mole AgX |
| Stabilizer STAB-1 | $3 \times 10^{-4}$ mole/mole AgX |
| Stabilizer STAB-2 | $3 \times 10^{-4}$ mole/mole AgX |
| Stabilizer STAB-3 | $3 \times 10^{-4}$ mole/mole AgX |
| Sensitizing dye BS-1 | $4 \times 10^{-4}$ mole/mole AgX |
| Sensitizing dye BS-2 | $1 \times 10^{-4}$ mole/mole AgX |

STAB-1: 1-(3-acetoamidophenyl)-5-mercaptotetrazole
STAB-2: 1-phenyl-5-mercaptotetrazole
STAB-3: 1-(4-ethoxyphenyl)-5-mercaptotetrazole
Preparation of Green-sensitive Silver Halide Emulsion (EM-G1)

A monodispersed cubic grain emulsion EMP-11A and EMP-11B were prepared in the same manner as in the preparation of EMP-1A except that the addition period of A1

Solution and B1 Solution, and the addition period of C1 Solution and D1 Solution were changed. The EMP-11A had an average grain diameter of 0.40 μm, and a silver chloride content of 99.5 mole %, and EMP-11B had an average grain diameter of 0.50 μm and a silver chloride content of 99.5 mole %. The aforementioned EMP-11A has subjected to optimum chemical sensitization at 60° C. using the following compounds. EMP-11B was also subjected to chemical sensitization in the same manner. The sensitized EMP-11A and EMP-11B were mixed in a ratio of 1:1 in terms of silver amount and a green-sensitive silver halide emulsion (Em-G1) was obtained.

| Sodium thiosulfate | 1.5 mg/mole AgX |
|---|---|
| Chloroauric acid | 1.0 mg/mole AgX |
| Sensitizing dye GS-1 | $4 \times 10^{-4}$ mole/AgX |
| Stabilizer STAB-1 | $3 \times 10^{-4}$ mole/mole AgX |
| Stabilizer STAB-2 | $3 \times 10^{-4}$ mole/mole AgX |
| Stabilizer STAB-3 | $3 \times 10^{-4}$ mole/mole AgX |

Preparation of Red-sensitive Silver Halide Emulsion (Em-R1)

A monodispersed cubic grain emulsion EMP-21A and EMP-21B were prepared in the same manner as in the preparation of EMP-1A except that the addition period of A1 Solution and B1 Solution, and the addition period of C1 Solution and D1 Solution were changed. The EMP-21A had an average grain diameter of 0.40 μm and a silver chloride content of 99.5 mole %, and EMP-21B had an average grain diameter of 0.38 μm and a silver chloride containing ratio of 99.5 mole %. The aforementioned EMP-21A underwent optimum chemical sensitization at 60° C. using the following compounds. EMP-21B was also subjected to chemical sensitization in the same manner. The sensitized EMP-21A and EMP-21B were mixed in a ratio of 1:1 in terms of silver amount and a red-sensitive silver halide emulsion (Em-R1) was obtained.

| Sodium thiosulfate | 1.8 mg/mole AgX |
|---|---|
| Chloroauric acid | 2.0 mg/mole AgX |
| Sensitizing dye RS-1 | $1 \times 10^{-4}$ mole/AgX |
| Sensitizing dye RS-2 | $1 \times 10^{-4}$ mole/AgX |
| SS-1 | $2.0 \times 10^{-3}$ mole/AgX |
| Stabilizer STAB-1 | $3 \times 10^{-4}$ mole/mole AgX |
| Stabilizer STAB-2 | $3 \times 10^{-4}$ mole/mole AgX |
| Stabilizer STAB-3 | $3 \times 10^{-4}$ mole/mole AgX |

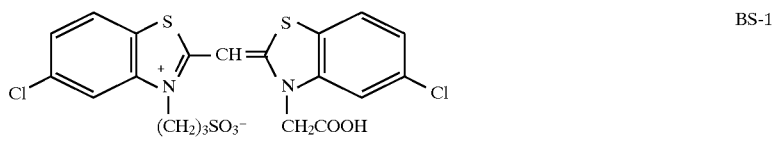

BS-1

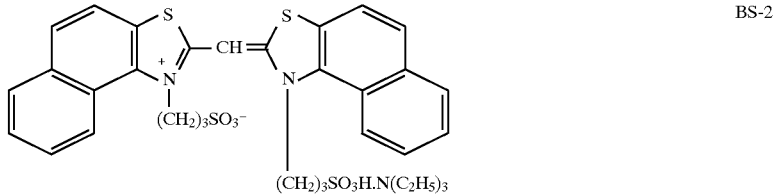

BS-2

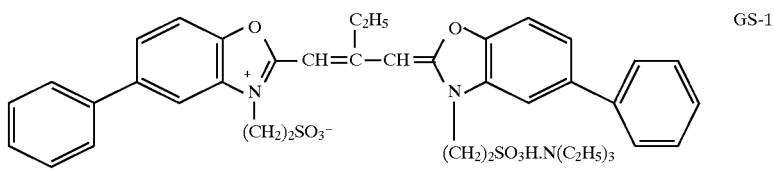

GS-1

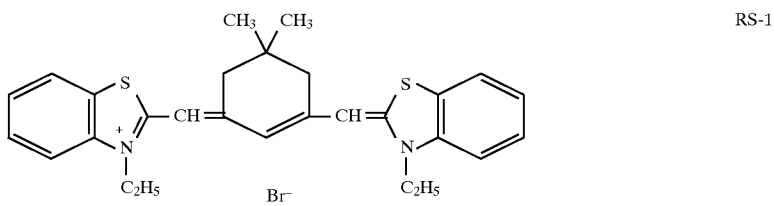

RS-1

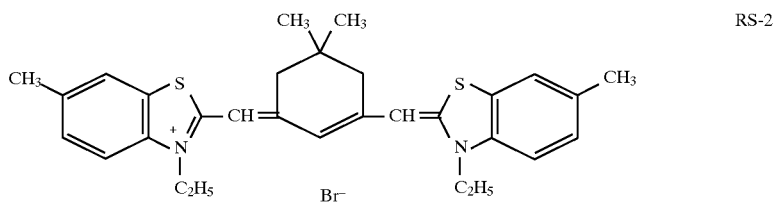

RS-2

-continued

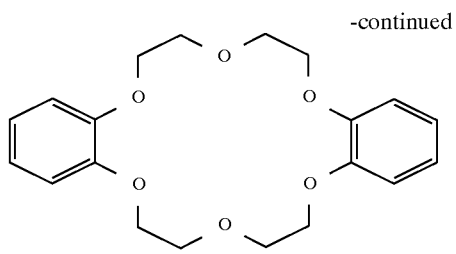

Preparation of Silver Halide Photographic Material (101)

High density polyethylene was laminated on both sides of paper pulp having a weight of 180 g/m² to prepare a paper support. Moreover, on the side for coating an emulsion layer, was laminated fused polyethylene containing a dispersion of a surface-treated anatase type titanium oxide of 15 percent by weight. The reflection support was subjected to corona discharging and a gelatin subbing was then performed. Furthermore, each layer having compositions in the following was coated to prepare a silver halide photographic material.

Coating solutions were prepared so as to render coating amount as described in the following and hardeners(H-1 and H-2) were added. As coating aids, surface active agents (SU-2) and SU-3) were added to control the surface tension. In addition, F-1 was added to each layer so that the total amount became 0.04 g/m².

The coating amounts of each layer are described hereinafter.

| Layer | Composition | Addition Amount (g/m²) |
|---|---|---|
| 7th layer (Protective Layer) | Gelatin | 1.00 |
| | DIDP | 0.002 |
| | DBP | 0.002 |
| | Silicon dioxide | 0.003 |
| 6th layer (UV absorbing layer) | Gelatin | 0.40 |
| | AI-1 | 0.01 |
| | UV absorber (UV-1) | 0.12 |
| | UV absorber (UV-2) | 0.04 |
| | UV absorber (UV-3) | 0.16 |
| | Antistaining agent (HQ-5) | 0.04 |
| | PVP | 0.03 |
| 5th layer (Red-sensitive layer) | Gelatin | 1.30 |
| | Red-sensitive Emulsion (Em-R1) | 0.18 |
| | Cyan coupler (C-1) | 0.28 |
| | Color image stabilizer (ST-1) | 0.10 |
| | Antistaining agent (HQ-1) | 0.004 |
| | DBP | 0.10 |
| | DOP | 0.20 |
| 4th layer (UV absorbing layer) | Gelatin | 0.94 |
| | UV absorber (UV-1) | 0.28 |
| | UV absorber (UV-2) | 0.09 |
| | UV absorber (UV-3) | 0.38 |
| | AI-1 | 0.02 |
| | Antistaining Agent (HQ-5) | 0.10 |
| 3rd layer | Gelatin | 1.30 |
| | AI-2 | 0.01 |
| | Green-sensitive emulsion (Em-G1) | 0.14 |
| | Magenta coupler (M-1) | 0.20 |
| | Color tone control agent (MY-1) | 0.08 |
| | Color image stabilizer (ST-3) | 0.20 |

SS-1

-continued

| Layer | Composition | Addition Amount (g/m²) |
|---|---|---|
| | Color image stabilizer (ST-4) | 0.17 |
| | DIDP | 0.13 |
| | DBP | 0.13 |
| 2nd layer (Interlayer) | Gelatin | 1.20 |
| | AI-3 | 0.01 |
| | Antistaining agent (HQ-2) | 0.03 |
| | Antistainin agent (HQ-3) | 0.03 |
| | Antistaining agent (HQ-4) | 0.05 |
| | Antistaining agent (HQ-5) | 0.23 |
| | DIDP | 0.04 |
| | DBP | 0.02 |
| | Optical brightening agent (W-1) | 0.10 |
| 1st layer | Gelatin | 1.20 |
| | Blue-sensitive emulsion (Em-B1) | 0.26 |
| | Yellow coupler (Y-1) | 0.40 |
| | Color image stabilizer (ST-1) | 0.10 |
| | Color image stabilizer (ST-2) | 0.10 |
| | Color image stabilizer (ST-5) | 0.10 |
| | Antistaining agent (HQ-1) | 0.01 |
| | Image stabilizer A | 0.15 |
| | DBP | 0.10 |
| | DNP | 0.05 |
| Support | Polyethylene laminated paper | |

Further, the coating amount of silver halide is represented by equivalent converted to silver.

SU-1: sodium tri-i-propylnaphthalenesulfonate

SU-2: sulfosuccinic acid di(2-ethylhexyl) sodium salt

SU-3: sulfosuccinic acid di(2,2,3,3,4,4,5,5-octafluoropentyl) sodium salt

H-1: tetrakis(vinylsulfonylmethyl)methane

H-2: 2,4-dichloro-6-hydroxy-s-triazine sodium

DBP: dibutyl phthalate

DIDP: diisodecyl phthalate

DOP: dioctyl phthalate

DNP: dinonyl phthalate

PVP: polyvinyl pyrrolidone

HQ-1: 2,5-di-t-octylhydroquinone

HQ-2: 2,5-di-sec-dodecylhydroquinone

HQ-3: 2,5-di-sec-tetradecylhydroquinone

HQ-4: 2-sec-dodecyl-5-sec-tetradecylhydroquinone

HQ-5: 2,5-di(1,1-dimethyl-4-hexyloxycarbonyl)butyl-hydroquinone

Image stabilizer: p-t-octyl phenol

| | |
|---|---|
| 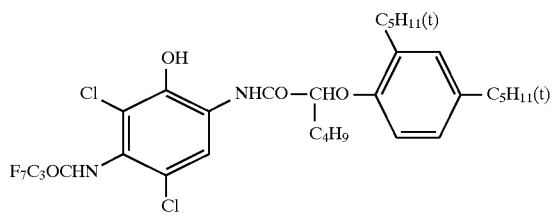 | C-1 |
| 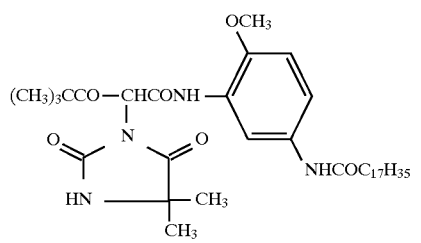 | Y-1 |
| 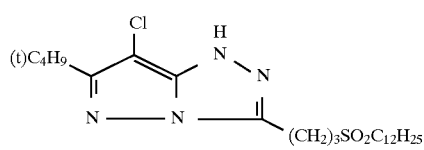 | M-1 |
|  | MY-1 |
| 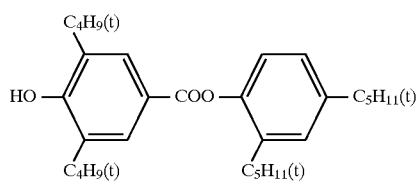 | ST-1 |
| 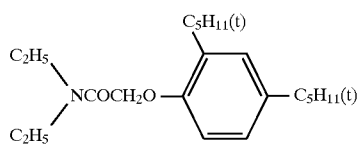 | ST-2 |
| 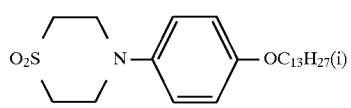 | ST-3 |
| 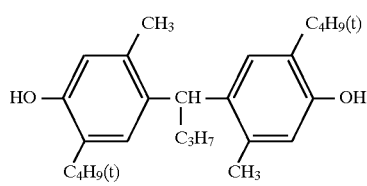 | ST-4 |
| 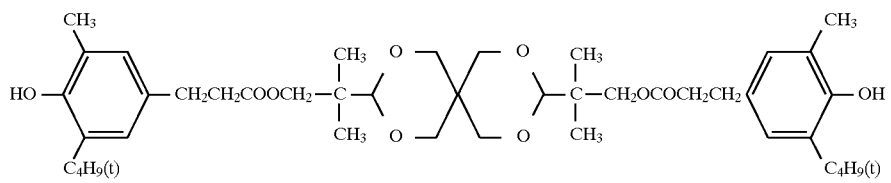 | ST-5 |

-continued
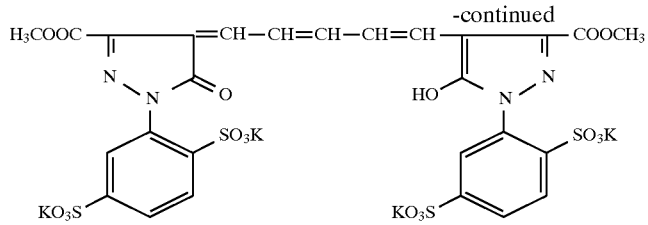 Al-1
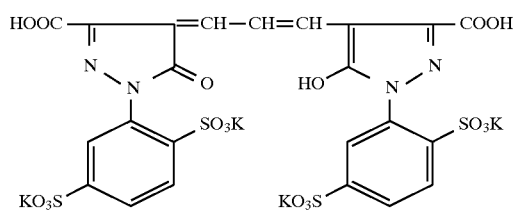 Al-2
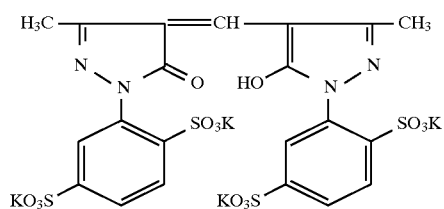 Al-3
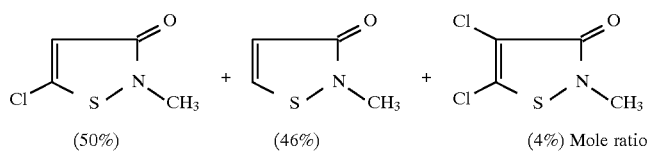 F-1
Mixture having mole ratio (50:46:4)
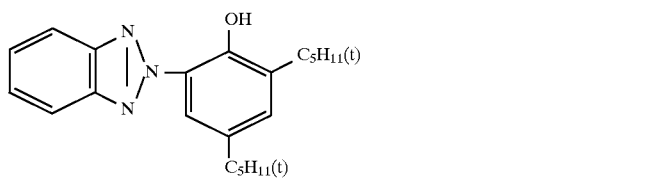 UV-1
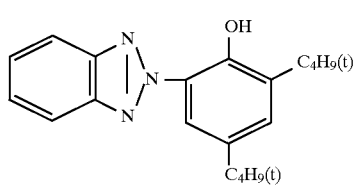 UV-2
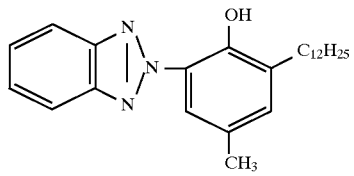 UV-3
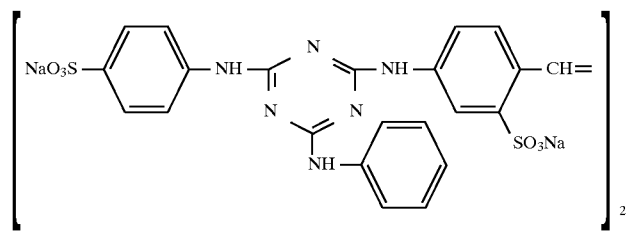 W-1
(Preparation of Light-sensitive Material (102))
A light-sensitive material (102) was prepared in the same manner as in the preparation of the light-sensitive material (101) except that the amount of silver halide in each light-sensitive layer was changed as shown in Table 1.

TABLE 1

| Light-sensitive | Amount of Silver Halide (g/m²) | | |
|---|---|---|---|
| Material | 1st Layer | 3rd Layer | 5th Layer |
| 101 | 0.26 | 0.14 | 0.18 |
| 102 | 0.033 | 0.020 | 0.013 |

Light-sensitive materials (101) and (102) prepared as described above were brought into contact with color-separated transparent originals comprising halftone dot images (negative type). Thus, the light-sensitive materials each were contacted with a halftone original for cyan images and exposed for 0.5 second with a red light through the original. Subsequently, they were contacted with a halftone original for magenta images and exposed for 0.5 second with a green light. Further, they were contacted with a halftone original for yellow images and exposed for 0.5 second with a blue light. Lastly, they were contacted with a halftone original for black images and exposed for 0.5 second with a white light. The intensity of each exposure was adjusted using an ND filter. Exposure Condition 1 was termed in which conditions were suitably adjusted so that the maximum density falls within an optimum value range as shown in Table 2. Furthermore, Exposure Condition 2 was termed in which conditions were suitably adjusted so that 50% dot gain falls within an optimum value range, as shown in Table 2. Herein, the term, "50% dot gain" means dot gain at the dot area of 50%.

The light-sensitive materials were exposed under the Exposure Condition 1 or the Exposure Condition 2, and processed with Process 1 or Process 2 described hereinafter. The density of colored images obtained was measured using a densitometer manufactured by X-rite Co. under the status T.

Process 1:

| Processing step | Processing Temperature | Time |
|---|---|---|
| Developing (CDC-1) | 38.0 ± 0.3° C. | 45 seconds |
| Bleach-fixing (BF-1) | 35.0 ± 0.5° C. | 20 seconds |
| Stabilizing | 30 to 34° C. | 60 seconds |
| Drying | 60 to 80° C. | 30 seconds |

Process 2:

| Processing step | Processing Temperature | Time |
|---|---|---|
| Amplifying Developing (CDA-1) | 33.0 ± 0.5° C. | Refer to Table 2. |
| Bleach-fixing (BF-1) | 35.0 ± 0.5° C. | 20 seconds |
| Stabilizing | 30 to 34° C. | 60 seconds |
| Drying | 60 to 80° C. | 30 seconds |

Compositions of each processing solution are shown in the following.
Color Developer (CDC-1)

| | |
|---|---|
| Deionized water | 800 ml |
| Triethylenediamine | 2 g |
| Diethylene glycol | 10 g |
| Potassium bromide | 0.01 g |
| Potassium chloride | 1.0 g |
| Potassium sulfite | 0.25 g |
| N-ethyl-N-hydroxyethyl-4-aminoaniline sulfate salt | 6.0 g |
| N,N-diethylhydoxylamine | 6.8 g |
| Triethanolamine | 10.0 g |
| Sodium diethylenetriamine-pentaacetate | 2.0 g |
| Potassium carbonate | 30 g |

Water is added to make 1 liter of the total volume and the pH is adjusted to 10.1 using sulfuric acid or potassium hydroxide.
Amplifying Developer (CDA-1)

| | |
|---|---|
| Deionized water | 800 ml |
| Potassium bromide | 0.001 g |
| Potassium chloride | 0.35 g |
| N-ethyl-N-hydroxyethyl-4-aminoaniline sulfonic acid salt | 4.0 g |
| N,N-diethylhydroxylamine | 4.7 g |
| Diethylenetriamine penta acetic acid sodium salt | 2.0 g |
| 1-hydroxyethylidene-1,1'-diphosphonic acid | 0.35 g |
| Optical brightening agent (4,4'-diaminostilbene disulfonic acid derivative) | 2.0 g |
| Potassium carbonate | 20 g |
| Hydrogen peroxide (5.99%) | 25 ml |

Water is added to make 1 liter of the total volume and the pH is adjusted to 9.8 using potassium carbonate or glacial acetic acid.
Bleach-Fixer (BF-1)

| | |
|---|---|
| Deionized water | 700 ml |
| Diethylenetriamine penta acetic acid ferrate ammonium dihydrate | 65 g |
| Diethylenetriamine penta acetic acid | 3 g |
| Ammonium thiosulfate (aqueous 70% solution) | 100 ml |
| 2-Amino-5-mercapto-1,3,4-thiazole | 2.0 g |
| Ammonium sulfite (aqueous 40% solution) | 27.5 ml |

Water is added to make 1 liter of the total volume and the pH is adjusted to 5.0 using potassium carbonate or glacial acetic acid.
Stabilizer

| | |
|---|---|
| Deionized water | 800 ml |
| o-Phenylphenol | 1.0 g |
| 5-Chloro-2-methyl-4-isothiazoline-3-on | 0.02 g |
| 2-Methyl-4-isothiazoline-on | 0.02 g |
| Diethylene glycol | 1.0 g |
| Optical brightening agent (Tivanol SFP) | 2.0 g |
| 1-Hydroxyethylidene-1,1'-disulfonic acid | 1.8 g |
| Bismuth chloride (aqueous 45% solution) | 0.65 g |
| Magnesium sulfate hepta hydrate | 0.2 g |
| PVP (polyvinyl pyrrolidone) | 1.0 g |
| Ammonia solution (aqueous ammonium hydroxide 25% solution) | 2.5 g |
| Nitrilotriacetic acid trisodium salt | 1.5 g |

Water is added to make 1 liter of the total volume and the pH was adjusted to 7.5 using sulfuric acid or aqueous ammonia solution.

Furthermore, each part of solid density (Dt) of a halftone image of 133 lines/inch, 50% halftone dot (D50), white background (Db) was measured using a densitometer, and a 50% dot gain (DG$_{50}$) was derived using the following Malley-Davies formula.

$$DG_{50} = \{(1-10)^{(Db-D50)}/(1-10^{(Db-Dt)})\} \times 100 - 50$$

Results are summarized and shown in Table 2.

TABLE 2

| No. | Light-sensitive Material | Exposure Condition | Amplifying Development Processing | Processing Time | Dot Gain(*) Y 19–25 | M 19–25 | C 19–25 | K 19–25 | Maximum Density(*) Y 0.94–1.06 | M 1.39–1.51 | C 1.29–1.41 | K 1.54–1.66 | Remarks |
|---|---|---|---|---|---|---|---|---|---|---|---|---|---|
| r101 | 101 | 1 | 1 | — | 17 | 17 | 18 | 18 | 1.01 | 1.45 | 1.36 | 1.60 | Comp. |
| r102 | 101 | 1 | 2 | 15 seconds | 20 | 21 | 21 | 21 | 1.02 | 1.45 | 1.38 | 1.61 | Inv. |
| r103 | 101 | 2 | 1 | — | 22 | 22 | 22 | 22 | 1.08 | 1.54 | 1.44 | 1.68 | Comp. |
| r104 | 101 | 2 | 2 | 15 seconds | 22 | 22 | 22 | 22 | 1.04 | 1.50 | 1.38 | 1.64 | Inv. |
| r105 | 102 | 1 | 1 | — | — | — | — | — | 0.38 | 0.42 | 0.45 | 0.54 | Comp. |
| r106 | 102 | 1 | 2 | 60 seconds | 23 | 22 | 23 | 22 | 1.02 | 1.45 | 1.35 | 1.58 | Inv. |
| r107 | 102 | 2 | 1 | — | — | — | — | — | 0.42 | 0.48 | 0.51 | 0.61 | Comp. |
| r108 | 102 | 2 | 2 | 60 seconds | 22 | 22 | 22 | 22 | 1.03 | 1.47 | 1.37 | 1.65 | Inv. |

(*)Values in the title column show preferred ones.

In Table 2, as shown in r101 and r103, when subjected to conventional color development process, the maximum density exceeds the preferred density in the case when the exposure amount is adjusted so that the dot gain becomes optimum; the dot gain becomes small when the exposure amount is adjusted so that the maximum density becomes optimum and as a result, the reproduction of the halftone dot is deteriorated. However, it is shown from (r102) and (r104) that when subjected to amplifying development process, both of the maximum density and dot gain fall within the preferred range and excellent halftone images are obtained. Furthermore, in the case of employing the light-sensitive material (102) with less silver amount, (r105) and (r107), when subjected to conventional color development process, yield no sufficient maximum density and the halftone image quality could not be evaluated. However, it is shown that (r106) and (r108) in which the light-sensitive material (102) were subjected to amplifying development process, resulted in a sufficient maximum density, both of the dot gain and maximum density fall within the preferred range and excellent reproduction of halftone images is achieved. Furthermore, it is found that especially, (r106) and (r108) yield images which resemble print originals in visual impression as compared to (r101) and (r104) and are excellent embodiments of the present invention.

Example 2

Preparation of Green-sensitive Silver Halide Emulsions (Em-G2 to Em-G6)

Green-sensitive sliver halide emulsions (Em-G2 to Em-G6) were prepared in the same manner as in the preparation of the green-sensitive silver halide emulsion Em-G1 in Example 1 except that the kind and amount of the metal complex incorporated in the C1 Solution employed for preparing unsensitized emulsions EMP-11A and EMP-11B, and amounts of sodium thiosulfate and chloroauric acid employed at chemical sensitization were changed to those as shown in Table 3.

TABLE 3

| Green-sensitive Silver Halide Emulsion | Metal complex contained in C1 Solution Kind | Addition Amount (mole) | Addition Amount of Sodium Thiosulfate | Addition Amount of Chloroauric acid |
|---|---|---|---|---|
| Em-G1 | $K_2[IrCl_6]$ | $4 \times 10^{-8}$ | 1.5 mg/mole AgX | 1.0 mg/mole AgX |
|  | $K_4[Fe(CN)_6]$ | $2 \times 10^{-5}$ |  |  |
| Em-G2 | $K_2[IrCl_6]$ | $4 \times 10^{-8}$ | 3.3 | — |
|  | $K_4[Fe(CN)_6]$ | $2 \times 10^{-5}$ |  |  |
| Em-G3 | $K_2[IrCl_6]$ | $1 \times 10^{-8}$ | 1.5 | 1.0 |
|  | $K_4[Fe(CN)_6]$ | $2 \times 10^{-5}$ |  |  |
|  | $Cs_2[Os(NO)Cl_5]$ | $1 \times 10^{-8}$ |  |  |
| Em-G4 | $Cs_2[Os(NO)Cl_5]$ | $1 \times 10^{-8}$ | 1.5 | 1.0 |
| Em-G5 | $K_2[IrCl_6]$ | $2 \times 10^{-5}$ | 1.5 | 1.0 |
| Em-G6 | — | — | 1.5 | 1.0 |

Preparation of Light-sensitive Materials (201 to 210)

Light-sensitive materials (201 to 205) were prepared in the same manner as in the preparation of the light-sensitive material (101) in Example 1 except that the green-sensitive silver halide emulsion was changed as shown in Table 4. Furthermore, light-sensitive materials (206 to 210) were prepared in the same manner as in the preparation of the light-sensitive material (102) except that the green-sensitive silver halide emulsion was changed as shown in Table 4.

Based on halftone image data, each of light-sensitive materials (101), (102) and (201) to (210) was subjected to scanning exposure using independently three laser radiation sources so that exposure time per pixel was adjusted to be $6.4 \times 10^{-7}$ second, based on the area modulation exposure, and processed according to the aforementioned Process 1 or Process 2. Exposure was performed using an Ar laser (oscillating wavelength 430 nm), a He-Ne laser (oscillating wavelength 544 nm), a semiconductor laser (oscillating wavelength 670 nm) as a light source. The images obtained were evaluated in the same way as in Example 1. The results are shown in Table 4.

TABLE 4

| No. | Light-sensitive Material | Green-sensitive Silver Halide Emulsion | Total Amount of AgX (g/m$^2$) | Processing | Amplifying Development Processing Time | Dot Gain(*) Y 19–25 | M 19–25 | C 19–25 | K 19–25 | Maximum Density(*) Y 0.94–1.06 | M 1.39–1.51 | C 1.29–1.41 | K 1.54–1.69 | Remarks |
|---|---|---|---|---|---|---|---|---|---|---|---|---|---|---|
| r201 | 101 | Em-G1 | 0.58 | 1 | — | 17 | 17 | 18 | 18 | 1.01 | 1.45 | 1.36 | 1.60 | Comp. |
| r202 | 101 | Em-G1 | 0.58 | 2 | 15 seconds | 20 | 21 | 21 | 21 | 1.02 | 1.45 | 1.38 | 1.61 | Inv. |
| r203 | 201 | Em-G2 | 0.58 | 1 | — | 17 | 16 | 18 | 18 | 1.01 | 1.42 | 1.36 | 1.59 | Comp. |
| r204 | 201 | Em-G2 | 0.58 | 2 | 15 seconds | 20 | 19 | 21 | 20 | 1.02 | 1.41 | 1.38 | 1.60 | Inv. |
| r205 | 202 | Em-G3 | 0.58 | 1 | — | 17 | 17 | 18 | 18 | 1.02 | 1.43 | 1.37 | 1.60 | Comp. |
| r206 | 202 | Em-G3 | 0.58 | 2 | 15 seconds | 20 | 22 | 21 | 22 | 1.02 | 1.45 | 1.38 | 1.61 | Inv. |
| r207 | 203 | Em-G4 | 0.58 | 1 | — | 17 | 17 | 18 | 18 | 1.01 | 1.44 | 1.36 | 1.60 | Comp. |
| r208 | 203 | Em-G4 | 0.58 | 2 | 15 seconds | 20 | 22 | 21 | 21 | 1.02 | 1.46 | 1.38 | 1.61 | Inv. |
| r209 | 204 | Em-G5 | 0.58 | 1 | — | 17 | 17 | 18 | 18 | 1.01 | 1.44 | 1.36 | 1.60 | Comp. |
| r210 | 204 | Em-G5 | 0.58 | 2 | 15 seconds | 20 | 22 | 21 | 22 | 1.02 | 1.45 | 1.38 | 1.61 | Inv. |
| r211 | 205 | Em-G6 | 0.58 | 1 | — | 17 | 16 | 18 | 18 | 1.01 | 1.42 | 1.36 | 1.58 | Comp. |
| r212 | 205 | Em-G6 | 0.58 | 2 | 15 seconds | 20 | 20 | 21 | 21 | 1.02 | 1.42 | 1.38 | 1.58 | Inv. |
| r213 | 102 | Em-G1 | 0.066 | 2 | 60 seconds | 23 | 22 | 23 | 22 | 1.01 | 1.45 | 1.38 | 1.58 | Inv. |
| r214 | 206 | Em-G2 | 0.066 | 2 | 60 seconds | 23 | 20 | 23 | 22 | 1.01 | 1.42 | 1.38 | 1.56 | Inv. |
| r215 | 207 | Em-G3 | 0.066 | 2 | 60 seconds | 23 | 22 | 23 | 22 | 1.01 | 1.45 | 1.38 | 1.61 | Inv. |
| r216 | 208 | Em-G4 | 0.066 | 2 | 60 seconds | 23 | 22 | 23 | 22 | 1.00 | 1.45 | 1.38 | 1.61 | Inv. |
| r217 | 209 | Em-G5 | 0.066 | 2 | 60 seconds | 23 | 22 | 23 | 22 | 1.00 | 1.46 | 1.38 | 1.60 | Inv. |
| r218 | 210 | Em-G6 | 0.066 | 2 | 60 seconds | 23 | 20 | 23 | 22 | 1.01 | 1.42 | 1.38 | 1.58 | Inv. |

(*)Values in the title column show preferred ones.

When processed in the Process 1 (conventional color development process), light-sensitive materials (102) and (206) to (210) with less amount of silver halide did not sufficiently high density and were not be able to make evaluation of obtained images.

From the results in Table 4, it is shown that when subjected to amplifying development process, the dot gain and maximum density fall within the preferred range as compared to the conventional color development process. It is particularly noted that in the case of employing the light-sensitive materials containing the silver halide emulsions in which a metal compound was occluded during the formation of silver halide grains, the dot gain and maximum density are both close to the median in the preferred range and preferred images are stably reproduced. It is further shown that particularly, (r213) to (r218) in which the amount of silver halide incorporated in each color image-forming layer is 0.05 g/m$^2$ or less in terms of silver and the total amount of silver halide is less, provide images close to original prints in visual impression, compared to (r202), (r204), (r206), (r208), (r210) and (r212), and are excellent embodiments of the present invention.

What is claimed is:

1. An image forming method for a silver halide photographic light sensitive material comprising a support having thereon a color image forming layer containing a silver halide emulsion and a dye forming coupler, said method comprising, (i) subjecting the photographic material to area modulation exposure and (ii) subjecting the exposed photographic material to amplifying development to form a color image.

2. The image forming method of claim 1, wherein in the step of (i), the photographic material is contacted with a transparent original comprising halftone dot images and exposed to light through the original.

3. The image forming method of claim 1, wherein in the step of (i), a halftone dot image is directly printed onto the photographic material by scanning exposure, which is controlled so as to have an exposing time of 10$^{-3}$ sec. or less per pixel.

4. The image forming method of claim 1, wherein said color image forming layer has a coating weight of silver of 0.05 mg/m$^2$ or less.

5. The image forming method of claim 1, wherein said silver halide emulsion comprises silver halide grains having a silver chloride content of 90 mol % or more.

6. The image forming method of claim 1, wherein said silver halide emulsion comprises silver halide grains containing a metal ion selected from the group consisting iron, iridium, platinum, ruthenium, gallium and osmium.

7. The image forming method of claim 1, said photographic material, comprising a support having thereon a yellow image forming layer containing a blue-sensitive silver halide emulsion and et yellow dye forming coupler, a magenta image forming layer containing a green-sensitive silver halide emulsion and a magenta dye forming coupler, and a cyan image forming layer containing a red-sensitive silver halide emulsion and a cyan dye forming coupler and each of the yellow, magenta and cyan image forming layers has a coating weight of silver of 0.05 mg/m$^2$ or less.

8. The image forming method of claim 1, wherein in the step of (ii), the exposed photographic material is processed (a) in a developing-amplifying solution containing a developing agent and an oxidizing agent, or (b) in a developing solution containing a developing agent and subsequently in an amplifying solution containing an oxidizing agent.

9. The image forming method of claim 8, wherein said oxidizing agent is hydrogen peroxide.

* * * * *